(12) United States Patent
Cao et al.

(10) Patent No.: US 11,271,063 B2
(45) Date of Patent: Mar. 8, 2022

(54) FLEXIBLE DISPLAY STRUCTURE AND ELECTRONIC DEVICE

(71) Applicant: WUHAN CHINA STAR OPTOELECTRONICS SEMICONDUCTOR DISPLAY TECHNOLOGY CO., LTD., Hubei (CN)

(72) Inventors: Haoran Cao, Hubei (CN); Pilgeun Chun, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 942 days.

(21) Appl. No.: 15/775,597

(22) PCT Filed: Apr. 4, 2018

(86) PCT No.: PCT/CN2018/081868
§ 371 (c)(1),
(2) Date: May 11, 2018

(87) PCT Pub. No.: WO2019/174076
PCT Pub. Date: Sep. 19, 2019

(65) Prior Publication Data
US 2021/0167157 A1   Jun. 3, 2021

(30) Foreign Application Priority Data
Mar. 13, 2018 (CN) .......................... 201810202632.4

(51) Int. Cl.
*H01L 27/32* (2006.01)
*H01L 51/00* (2006.01)
*H01L 25/18* (2006.01)

(52) U.S. Cl.
CPC .......... *H01L 27/3276* (2013.01); *H01L 25/18* (2013.01); *H01L 27/323* (2013.01); *H01L 51/0097* (2013.01); *H01L 2251/5338* (2013.01)

(58) Field of Classification Search
CPC . H01L 27/3276; H01L 25/18; H01L 51/0097; H01L 27/323; H01L 2251/5338
See application file for complete search history.

(56) References Cited

U.S. PATENT DOCUMENTS 9,276,055 B1 * 3/2016 Son ........................ H01L 27/323
2014/0300270 A1 * 10/2014 Sakamoto .............. H05B 33/04
315/51
2016/0204183 A1   7/2016 Tao et al.
(Continued)

FOREIGN PATENT DOCUMENTS

CN     103560119 A    2/2014
CN     105789252 A    7/2016
(Continued)

*Primary Examiner* — Kyoung Lee (57) ABSTRACT

A flexible display structure and an electronic device are disclosed, which both includes a flexible substrate having a first region, at least one second region, and at least one first bendable region; a display function layer disposed on the first region; and a first function assembly disposed on the at least one second region and electrically connected to the display function layer through the first metal wiring.

18 Claims, 3 Drawing Sheets

(56) References Cited

U.S. PATENT DOCUMENTS

2016/0204366 A1* 7/2016 Zhang ................... H01L 27/326
                                                                257/40
2017/0126865 A1* 5/2017 Lee ..................... H04M 1/0266
2017/0367173 A1   12/2017 Park et al.
2018/0315804 A1   11/2018 Li et al.

FOREIGN PATENT DOCUMENTS

| CN | 106252380 A | 12/2016 |
| CN | 107425142 A | 12/2017 |
| CN | 107464878 A | 12/2017 |

* cited by examiner

FIG.6

FLEXIBLE DISPLAY STRUCTURE AND ELECTRONIC DEVICE

CROSS-REFERENCE TO RELATED APPLICATIONS

This application is a National Stage of International Application No. PCT/CN2018/081868, filed Apr. 4, 2018, which claims the benefit of and priority to Chinese Patent Application No. 201810202632.4, filed Mar. 13, 2018, the entireties of which are hereby incorporated herein by reference.

FIELD OF INVENTION

The present disclosure relates to the technical field of AMOLED displays, and specifically to a flexible display structure and an electronic device.

BACKGROUND OF INVENTION

Structure of an AMOLED display has three layers that are an AMOLED screen layer, a touch screen panel layer, and an outer protection glass layer. In the prior art, a driver chip and other control circuits of the AMOLED display are provided on additional circuit boards. However, electronic devices are increasingly pursuing miniaturization. How to save space by laying electronic components inside the electronic devices is a problem.

Therefore, there are some defects in the prior art and it needs to be urgently improved.

SUMMARY OF INVENTION

An objective of embodiments of the present disclosure is to provide a flexible display structure and an electronic device, which have beneficial effects of saving internal space of the electronic device.

A flexible display structure is provided in an embodiment of the present disclosure, and includes:
a flexible substrate including a first region, at least one second region, and at least one first bendable region, wherein the first region is connected to the at least one second region through the at least one first bendable region, and the at least one first bendable region has a first metal wiring;
a display function layer disposed on the first region;
a first function assembly disposed on the at least one second region and electrically connected to the display function layer through the first metal wiring; and
a second function assembly;
wherein the flexible substrate further includes at least one third region and at least one second bendable region, wherein the at least one third region is connected to the at least one second region through the at least one second bendable region, the at least one second bendable region has a second metal wiring, and the second function assembly is disposed on the at least one third region; and
wherein the display function layer includes:
a TFT array layer disposed on the flexible substrate;
a light emitting layer disposed on the TFT array layer;
a thin film packaging layer disposed on the light emitting layer; and
a transparent protective layer disposed on the thin film packaging layer.

In the flexible display structure of the present disclosure, the display function layer further includes a polarizer and a touch control layer, and both of the polarizer and the touch control layer are disposed between the thin film packaging layer and the transparent protective layer; and
adhesive layers are disposed between the polarizer, the touch control layer, the thin film packaging layer and the transparent protective layer.

In the flexible display structure of the present disclosure, the first function assembly includes at least one chip configured to drive the display function layer and configured to identify and process signals of the touch control layer.

In the flexible display structure of the present disclosure, the first function assembly further includes at least one of an acceleration sensor, a fingerprint sensor, a pressure sensor, a scanning sensor, and an antenna module.

The flexible display structure of the present disclosure further includes an electromagnetic shielding structure configured to shield from electromagnetic interference, wherein the electromagnetic shielding structure is disposed on the flexible substrate.

In the flexible display structure of the present disclosure, the display function layer includes a third metal wiring disposed on the first region, wherein the third metal wiring, the first metal wiring, and the second metal wiring are electrically connected in sequence, and the first metal wiring, the second metal wiring, and the third metal wiring are formed by a single photomask technology.

In the flexible display structure of the present disclosure, the first region has a rectangular shape and the at least one second region has an irregular outline.

Another flexible display structure is also provided in an embodiment of the present disclosure, and includes:
a flexible substrate comprising a first region, at least one second region, and at least one first bendable region, wherein the first region is connected to the at least one second region through the at least one first bendable region, and the at least one first bendable region has a first metal wiring;
a display function layer disposed on the first region; and
a first function assembly disposed on the at least one second region and electrically connected to the display function layer through the first metal wiring.

The another flexible display structure of the present disclosure further includes a second function assembly;
wherein the flexible substrate further includes at least one third region and at least one second bendable region, wherein the at least one third region is connected to the at least one second region through the at least one second bendable region, the at least one second bendable region has a second metal wiring, and the second function assembly is disposed on the at least one third region.

In the another flexible display structure of the present disclosure, the display function layer includes:
a TFT array layer disposed on the flexible substrate;
a light emitting layer disposed on the TFT array layer;
a thin film packaging layer disposed on the light emitting layer; and
a transparent protective layer disposed on the thin film packaging layer.

In the another flexible display structure of the present disclosure, the display function layer further includes a polarizer and a touch control layer, and both of the polarizer and the touch control layer are disposed between the thin film packaging layer and the transparent protective layer; and
adhesive layers are disposed between the polarizer, the touch control layer, the thin film packaging layer and the transparent protective layer.

In the another flexible display structure of the present disclosure, the first function assembly includes at least one chip configured to drive the display function layer and configured to identify and process signals of the touch control layer.

In the another flexible display structure of the present disclosure, the first function assembly further includes at least one of an acceleration sensor, a fingerprint sensor, a pressure sensor, a scanning sensor, and an antenna module.

The another flexible display structure of the present disclosure further includes an electromagnetic shielding structure configured to shield from electromagnetic interference, wherein the electromagnetic shielding structure is disposed on the flexible substrate.

In the another flexible display structure of the present disclosure, the first region has a first edge, a second edge opposite to the first edge, a third edge, and a fourth edge opposite to the third edge; and the number of the at least one second region is four, wherein the first edge, the second edge, the third edge, and the fourth edge are connected to one of the four second regions, respectively.

The display function layer includes a third metal wiring disposed on the first region, wherein the third metal wiring, the first metal wiring, and the second metal wiring are electrically connected in sequence, and the first metal wiring, the second metal wiring, and the third metal wiring are formed by a single photomask technology.

The first region has a rectangular shape and the at least one second region has an irregular outline.

An electronic device is provided in an embodiment of the present disclosure, and includes a casing and a flexible display structure as described above disposed on the casing.

In the present disclosure, the flexible substrate of the flexible display structure is provided with a bendable structure to dispose some functional assemblies on the flexible substrate, thereby saving internal space of the electronic device and cost.

BRIEF DESCRIPTION OF DRAWINGS

In order to more clearly explain the technical solutions in the embodiments of the present disclosure, the drawings used in the description of the embodiments will be briefly described. It should be obvious that the drawings in the following description are merely some embodiments of the present disclosure. For those skilled in the art, other drawings may also be obtained, based on these drawings, without any creative work.

DETAILED DESCRIPTION OF PREFERRED EMBODIMENTS

Embodiments are described below in detail and are illustrated in the accompanying drawings, in which the same or similar reference numerals throughout the drawings denote elements having the same or similar functions. The embodiments described below with reference to the drawings are exemplary, that are used for explaining the present disclosure only, and should not be construed as limits to the present disclosure.

In the description of the present disclosure, it is to be understood that, the terms "center", "longitudinal", "transverse", "length", "width", "thickness", "up", "down", "front", "rear" "left", "right", "vertical", "horizontal", "top", "bottom", "inner", "outer", and the like, indicate relationships of orientations or positions, merely for the purpose of facilitating the description of the present disclosure and the simplified description, rather than indicating or implying that the devices or elements have to have a specific orientation, or be constructed and operated in a particular orientation, and therefore may not be construed as limits to the present disclosure. In addition, the terms "first" and "second" are merely used for illustrative purposes only, but are not to be construed as indicating or imposing a relative importance or implicitly indicating the number of technical features indicated. Thus, a feature that defines "first" or "second" may expressly or implicitly comprise one or more of the features. In the description of the present disclosure, the meaning of "plural" is two or more, unless otherwise specified.

In the description of the present disclosure, it should be noted that, unless otherwise expressly stated and defined, the terms "install", "interconnect", and "connect", should be broadly understood; for example, it may be a fixed connection, a detachable connection, or integral connection; it may be a mechanical connection, an electrical connection, or a communication with each other; it may be a directed connection, an indirected connection via an intermediate medium, an internal connection between two components, or an interaction between two components. Those of ordinary skill in the art can understand the specific meanings of the above terms in the present disclosure according to specific conditions.

In the present disclosure, unless otherwise expressly stated and defined, a first feature is "above" or "below" a second feature may include direct contact between the first and second features, and may also include that the first and second features are not in direct contact but are contacted by another feature between the first and second features. Moreover, the first feature "above" the second feature includes the first feature being directly above and diagonally above the second feature, or merely indicating that the first feature is higher in horizontal height than the second feature. The first feature "below" the second feature includes the first feature being directly below and diagonally below the second feature, or merely indicating that the first feature is lower in horizontal height than the second feature.

The disclosure herein provides many different embodiments or examples for implementing different structures of the present disclosure. In order to simplify the disclosure of the present disclosure, the components and settings of specific examples are described below. Of course, they are merely examples and it is not intended to limit the present disclosure. In addition, the present disclosure may repeat reference numerals and/or reference letters in different examples. This repetition is used for the purpose of simplification and clarity and does not indicate the relationship between the various embodiments and/or settings discussed. In addition, the present disclosure provides examples of various specific processes and materials, but one of ordinary skill in the art may be aware of applications of other processes and/or use of other materials.

Figure 1:
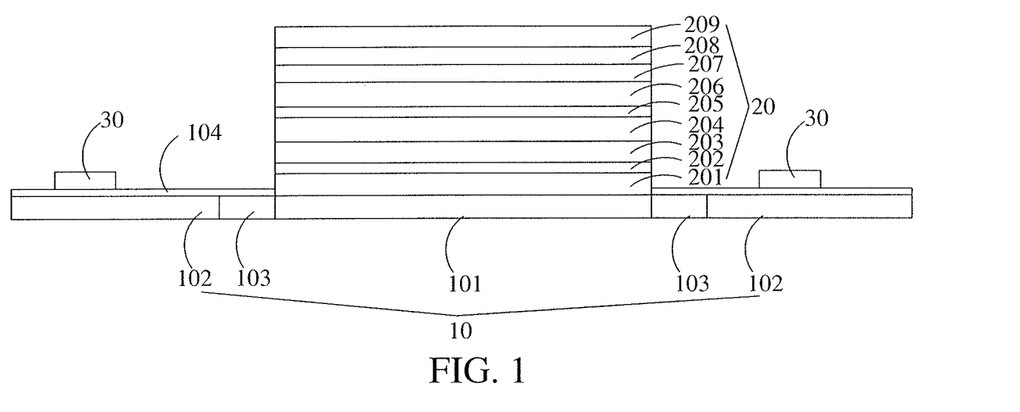
FIG. 1 is a structural schematic of a flexible display structure in some embodiments of the present disclosure.

Please refer to FIG. 1, which is a structural schematic of a flexible display structure in some embodiments of the present disclosure, and includes a flexible substrate 10, a display function layer 20, and a first function assembly 30, in which AMOLED is an abbreviation of "Active Matrix Organic Light Emitting Diode" for a description as below.

The flexible substrate 10 includes a first region 101, at least one second region 102, and at least one first bendable region 103, wherein the first region 101 is connected to the at least one second region 102 through the at least one first bendable region 103, and the at least one first bendable region 103 has a first metal wiring 104. The flexible substrate 10 is made of a polyimide (PI) substrate. It may be understood that, the material of the substrate is not limited thereto, and other materials may also be adopted.

The display function layer 20 is disposed on the first region 101, wherein the display function layer 20 includes a TFT array layer 201, a light emitting layer 202, a thin film packaging layer 203, a first adhesive layer 204, a polarizer 205, a second adhesive layer 206, a touch control layer 207, a third adhesive layer 208, and a transparent protective layer 209.

The TFT array layer 201 is disposed on the flexible substrate; the light emitting layer 202 is disposed on the TFT array layer 201; the thin film packaging layer 203 is disposed on the light emitting layer 202; the first adhesive layer 204 is disposed on the thin film packaging layer 203; and the polarizer 205 is disposed on the first adhesive layer 204. In addition, the second adhesive layer 206 is disposed on the polarizer 205; the touch control layer 207 is disposed on the second adhesive layer 206; the third adhesive layer 208 is disposed on the touch control layer 207; and the transparent protective layer 209 is disposed on the third adhesive layer 208. Furthermore, The first adhesive layer 204, the second adhesive layer 206, and the third adhesive layer 208 may be made of a pressure sensitive adhesive (PSA) material or an optically clear adhesive (OCA) material.

The TFT array layer 201 is electrically connected to the first function assembly 30 through the first metal wiring.

The first function assembly 30 is disposed on the at least one second region 102, and the first function assembly 30 is electrically connected to the TFT array layer 201 of the display function layer 20 through the first metal wiring.

The first function assembly 30 includes at least one chip. The number of at least one chip is two, the two chips are a driving chip and a touch control chip. The driving chip is configured to drive the display function layer for the AMOLED, and the touch control chip is configured to identify and process signals of the touch control layer. It may be understood that, the driving chip and the touch control chip may be integrated in a single chip.

In some embodiments, the first function assembly 30 further includes at least one of an acceleration sensor, a fingerprint sensor, a pressure sensor, a scanning sensor, and an antenna module.

Figure 2:
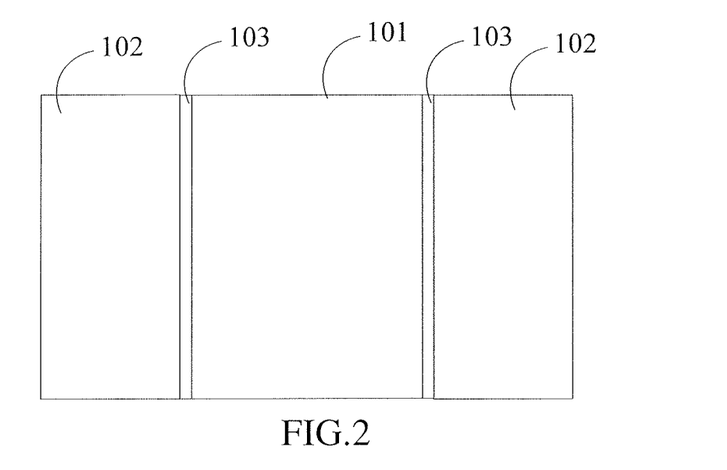
FIG. 2 is a first structural schematic of the flexible display structure in the embodiments of the present disclosure.

Please refer to FIG. 2, the flexible substrate 10 includes two second regions 102. The two second regions 102 are symmetrically disposed at two sides of the first region 101. After the two second regions 102 are folded, the two second regions 102 partially coincide with the first region 101. That is, the two second regions 102 are located in the same layer. Understandably, the two second regions 102 may be located in different layers, one of the two second regions 102 is in coincidence with the first region 101, and another of the two second regions 102 is in coincidence with the one of the two second regions 102.

The first region 101 and the second regions 102 both have a rectangular shape or a rounded rectangular shape.

Figure 3:
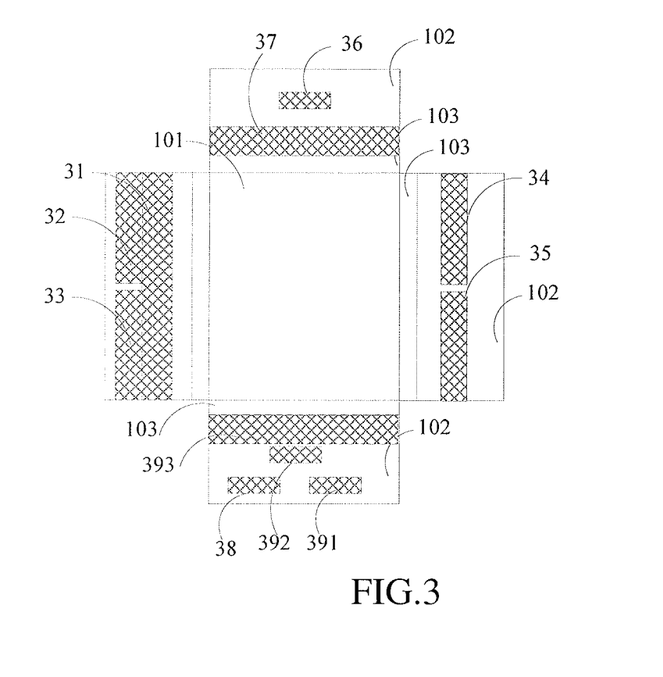
FIG. 3 is a second structural schematic of the flexible display structure in the embodiments of the present disclosure.

In some embodiments, please refer to FIG. 3, the first region 101 includes a first edge, a second edge opposite to the first edge, a third edge, and a fourth edge opposite to the third edge, and the number of the at least one second region 102 is four, wherein the first edge, the second edge, the third edge, and the fourth edge are connected with one of the four second regions 102, respectively. After the four second regions 102 are folded, the four second regions 102 partially coincide with the first region 101, respectively. That is, the four second regions 102 are located in the same layer. It may be understood that, the four second regions 102 may be located in different layers, the four second regions 102 are sequentially overlapped, and the area of each of the four second regions 102 is similar to the area of the first region 101. The first region 101 and the second regions 102 both have a rectangular shape or a rounded rectangular shape.

In a preferred embodiment, the second region 102 has an irregular shape. Understandably, when a flexible display panel is applied to electronic devices such as mobile phones, tablets, watches, and the like, the relevant parts of the electronic devices are disposed in a space under the back of the flexible display panel. Therefore, when the second region is bent to the back of the first region, if the second region is set to an irregular shape, then the space will be made available for the relevant parts, which is advantageous to the reduction of the thickness of the devices. Specifically, for example, the second region has an irregular shape to form one or more openings, or has holes in the second region. In this way, after the folding, the locations of the openings or the holes of the second region may be thinner, and other parts in the electronic device, such as a camera, may be disposed between the locations and a housing of the electronic device.

In this embodiment, the first function assembly 30 includes a first metal connection wire 31, a 3D pressure sensor 32, a fingerprint identification sensor 33, a scanning sensor 34, a touch control chip 38, a driving chip 391, a sensing chip 392, a second metal connection wire 393, a communication module 36, and sensors 35 with other functions. The 3D pressure sensor 32 and the fingerprint identification sensor 33 are electrically connected to the first metal wiring of the second region 102 through the first metal connection wire 31, and the touch control chip 38, the driving chip 391, and the sensing chip 392 are electrically connected to the first metal wiring of the second region 102 through the second metal connection wire 393.

Figure 4:
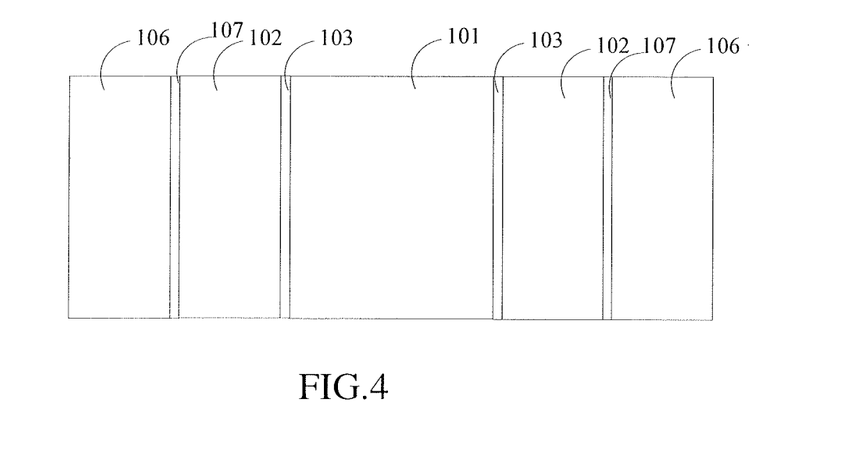
FIG. 4 is a third structural schematic of the flexible display structure in the embodiments of the present disclosure.

In some embodiments, please refer to FIG. 4, the flexible display structure of the present disclosure further includes a second function assembly. The flexible substrate 10 further includes at least one third region 106 and at least one second bendable region 107, wherein the at least one third region 106 is connected to the at least one second region 102 through the at least one second bendable region 107, and the at least one second bendable region 107 has a second metal wiring. The second function assembly is disposed on the at least one third region 106 and electrically connected to the first function assembly through the second metal wiring. The first region 101 and the second region 102 both has a rectangular shape or a rounded rectangular shape, and the at least one second bendable region 107 and the at least one first bendable region both have a rectangular strip shape.

The second function assembly may be one or more of an acceleration sensor, a fingerprint sensor, a pressure sensor, a scanning sensor, and an antenna module.

In some embodiments, the display function layer includes a third metal wiring disposed on the first region, the third metal wiring is electrically connected with the TFT array layer. In addition, the third metal wiring, the first metal wiring, and the second metal wiring are electrically connected in sequence, and the first metal wiring, the second metal wiring, and the third metal wiring are formed by a single photomask technology. Furthermore, the third metal wiring, the first metal wiring, and the second metal wiring may be formed with source/drain metal layers of the TFT array layer together by the single photomask technology.

Figure 5:
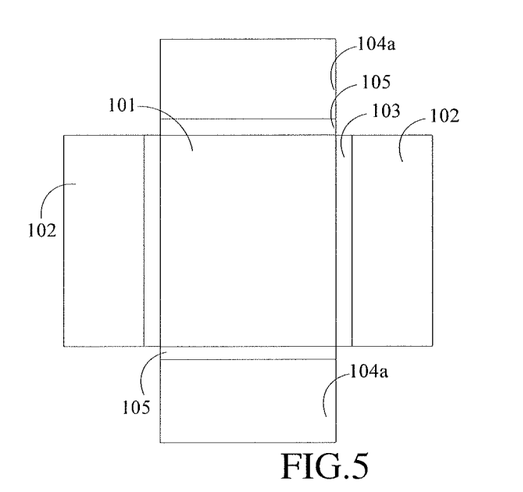
FIG. 5 is a fourth structural schematic of the flexible display structure in the embodiments of the present disclosure.

Please refer to FIG. 5, in the flexible display structure of the present disclosure, the first region 101 includes a first edge, a second edge opposite to the first edge, a third edge, and a fourth edge opposite to the third edge. The flexible display structure further includes an electromagnetic shielding structure. The flexible substrate 10 further includes two electromagnetic shielding regions 104a and third bendable regions 105, and the two electromagnetic shielding regions are connected with the first edge and the second edge through the third bendable regions 105. The number of the at least one second region 102 is two, the two second regions 102 are connected with the third edge and the fourth edge, respectively. Furthermore, the electromagnetic shielding structure is a shielding coating, and is provided at the two electromagnetic shielding regions 104a of the flexible substrate 10.

When the flexible substrate 10 is folded, the two electromagnetic shielding regions 104a are alternately folded with the two second regions 102, so as to prevent electromagnetic interference from overlapping of two layers of the electronic components. In addition, the area of each second region 102 and the area of each electromagnetic shielding region 104a are equal to the area of the first region 101, and the first region 101, the second regions 102, and the electromagnetic shielding regions 104a all have a rectangular shape.

In the present disclosure, the flexible substrate of the flexible display structure is provided with a bendable structure to dispose some functional assemblies on the flexible substrate, thereby saving internal space of the electronic device and cost.

Figure 6:
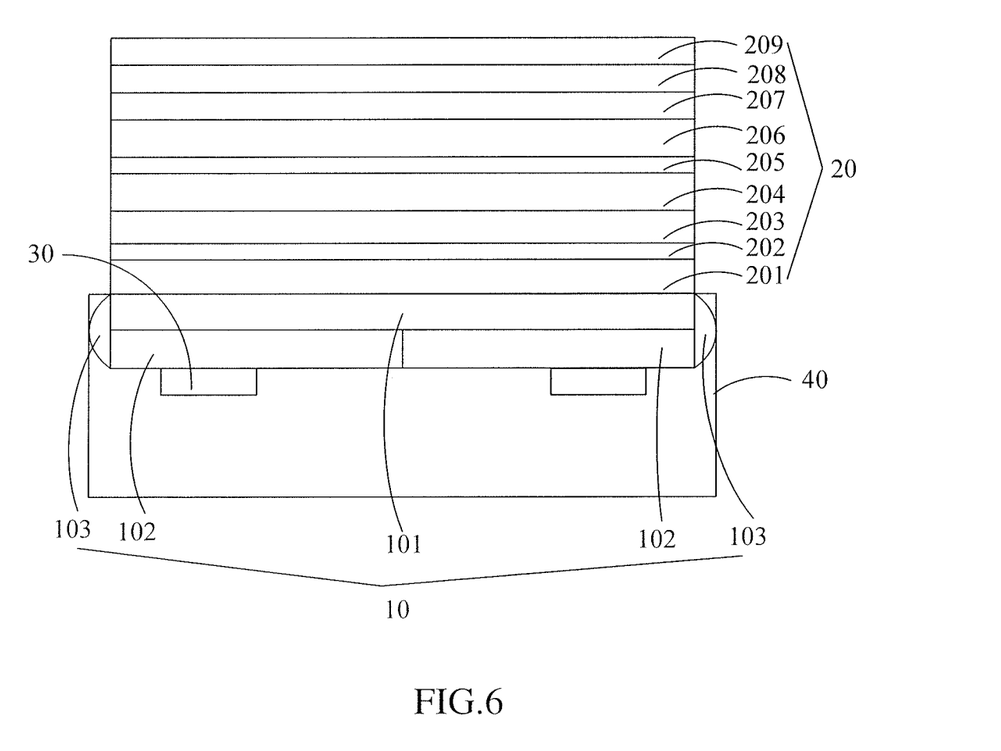
FIG. 6 is a structural schematic of an electronic device in the embodiments of the present disclosure.

Please refer to FIG. 6, an electronic device is also provided in the present disclosure, and includes a casing 40 and a flexible display structure as described above disposed on the casing 40. Wherein, the flexible display structure includes a flexible substrate 10, a display function layer 20, and a first function assembly 30.

The casing 40 may be made of a non-metal material that is configured to form an external outline of the electronic device.

The flexible substrate 10 includes a first region 101, at least one second region 102, and at least one first bendable region 103, wherein the first region 101 is connected to the at least one second region 102 through the at least one first bendable region 103, and the at least one first bendable region 103 has a first metal wiring 104. The flexible substrate 10 is made of a polyimide (PI) substrate.

The display function layer 20 is disposed on the first region 101, wherein the display function layer 20 includes a TFT array layer 201, a light emitting layer 202, a thin film packaging layer 203, a first adhesive layer 204, a polarizer 205, a second adhesive layer 206, a touch control layer 207, a third adhesive layer 208, and a transparent protective layer 209.

The TFT array layer 201 is disposed on the flexible substrate; the light emitting layer 202 is disposed on the TFT array layer 201; the thin film packaging layer 203 is disposed on the light emitting layer 202; the first adhesive layer 204 is disposed on the thin film packaging layer 203; and the polarizer 205 is disposed on the first adhesive layer 204. In addition, the second adhesive layer 206 is disposed on the polarizer 205; the touch control layer 207 is disposed on the second adhesive layer 206; the third adhesive layer 208 is disposed on the touch control layer 207; and the transparent protective layer 209 is disposed on the third adhesive layer 208.

Understandably, the order the polarizer 205 and the touch control layer 207 may be adjusted.

The first adhesive layer 204, the second adhesive layer 206, and the third adhesive layer 208 are all transparent optical adhesives, so as to achieve the connection between different layers, and have a higher transparency.

The TFT array layer 201 is electrically connected to the first function assembly through the first metal wiring.

The first function assembly 30 is disposed on the at least one second region 102, and the first function assembly 30 is electrically connected to the TFT array layer 201 of the display function layer 20 through the first metal wiring.

The first function assembly 30 includes a driving chip configured to drive the display function layer for the AMOLED and a touch control chip configured to identify and process signals of the touch control layer.

In some embodiments, the first function assembly 30 further includes at least one of an acceleration sensor, a fingerprint sensor, a pressure sensor, a scanning sensor, and an antenna module.

During installation, the second region 102 of the flexible substrate 10 is folded and located in the casing 40. Correspondingly, the first function assembly located in the second region 102 may be also located in the casing 40.

In the present disclosure, the first bendable region, the second bendable region, and the third bendable region are subjected to special treatment at the corresponding positions of the flexible substrate, so that the flexible substrate is more flexible as well as more easily curled and folded.

In the present disclosure, the flexible substrate of the flexible display structure is provided with a bendable structure to dispose some functional assemblies on the flexible substrate, thereby saving the internal space of the electronic device and cost.

Specific examples are used herein to describe the principles and embodiments of the present disclosure. The above embodiments are only used to assist in understanding the present disclosure. Simultaneously, those skilled in the art will have changes in specific implementation manners and application ranges based on the idea of the present disclosure. In summary, the contents of this specification should not be construed as limits of the present disclosure.

What is claimed is:
1. A flexible display structure, comprising:
a flexible substrate comprising a first region, at least one second region, and at least one first bendable region, wherein the first region is connected to the at least one second region through the at least one first bendable region, and the at least one first bendable region has a first metal wiring;
a display function layer disposed on the first region;
a first function assembly disposed on the at least one second region and electrically connected to the display function layer through the first metal wiring;

an electromagnetic shielding structure configured to shield from electromagnetic interference, wherein the electromagnetic shielding structure is disposed on the flexible substrate; and a second function assembly;

wherein the flexible substrate further comprises at least one third region and at least one second bendable region, wherein the at least one third region is connected to the at least one second region through the at least one second bendable region, the at least one second bendable region has a second metal wiring, and the second function assembly is disposed on the at least one third region; and wherein the display function layer comprises:
a TFT array layer disposed on the flexible substrate;
a light emitting layer disposed on the TFT array layer;
a thin film packaging layer disposed on the light emitting layer; and
a transparent protective layer disposed on the thin film packaging layer.

2. The flexible display structure as claimed in claim 1, wherein the display function layer further comprises a polarizer and a touch control layer, and both of the polarizer and the touch control layer are disposed between the thin film packaging layer and the transparent protective layer; and
wherein adhesive layers are disposed between the polarizer, the touch control layer, the thin film packaging layer and the transparent protective layer.

3. The flexible display structure as claimed in claim 2, wherein the first function assembly comprises at least one chip configured to drive the display function layer and configured to identify and process signals of the touch control layer.

4. The flexible display structure as claimed in claim 3, wherein the first function assembly further comprises at least one of an acceleration sensor, a fingerprint sensor, a pressure sensor, a scanning sensor, and an antenna module.

5. The flexible display structure as claimed in claim 1, wherein the display function layer comprises a third metal wiring disposed on the first region, and the third metal wiring, the first metal wiring, and the second metal wiring are electrically connected in sequence.

6. The flexible display structure as claimed in claim 1, wherein the first region has a rectangular shape and the at least one second region has an irregular outline.

7. A flexible display structure, comprising:
a flexible substrate comprising a first region, at least one second region, and at least one first bendable region, wherein the first region is connected to the at least one second region through the at least one first bendable region, and the at least one first bendable region has a first metal wiring;
a display function layer disposed on the first region;
a first function assembly disposed on the at least one second region and electrically connected to the display function layer through the first metal wiring; and
an electromagnetic shielding structure configured to shield from electromagnetic interference, wherein the electromagnetic shielding structure is disposed on the flexible substrate.

8. The flexible display structure as claimed in claim 7, further comprising a second function assembly;
wherein the flexible substrate further comprises at least one third region and at least one second bendable region, wherein the at least one third region is connected to the at least one second region through the at least one second bendable region, the at least one second bendable region has a second metal wiring, and the second function assembly is disposed on the at least one third region.

9. The flexible display structure as claimed in claim 7, wherein the display function layer comprises:
a TFT array layer disposed on the flexible substrate;
a light emitting layer disposed on the TFT array layer;
a thin film packaging layer disposed on the light emitting layer; and
a transparent protective layer disposed on the thin film packaging layer.

10. The flexible display structure as claimed in claim 9, wherein the display function layer further comprises a polarizer and a touch control layer, and both of the polarizer and the touch control layer are disposed between the thin film packaging layer and the transparent protective layer; and
wherein adhesive layers are disposed between the polarizer, the touch control layer, the thin film packaging layer and the transparent protective layer.

11. The flexible display structure as claimed in claim 10, wherein the first function assembly comprises at least one chip configured to drive the display function layer and configured to identify and process signals of the touch control layer.

12. The flexible display structure as claimed in claim 11, wherein the first function assembly further comprises at least one of an acceleration sensor, a fingerprint sensor, a pressure sensor, a scanning sensor, and an antenna module.

13. The flexible display structure as claimed in claim 8, wherein the display function layer comprises a third metal wiring disposed on the first region, and the third metal wiring, the first metal wiring, and the second metal wiring are electrically connected in sequence.

14. The flexible display structure as claimed in claim 7, wherein the first region has a rectangular shape and the at least one second region has an irregular outline.

15. An electronic device comprising a casing and a flexible display structure disposed on the casing;
wherein the flexible display structure comprises:
a flexible substrate comprising a first region, at least one second region, and at least one first bendable region, wherein the first region is connected to the at least one second region through the at least one first bendable region, and the at least one first bendable region has a first metal wiring;
a display function layer disposed on the first region;
a first function assembly disposed on the at least one second region and electrically connected to the display function layer through the first metal wiring; and
an electromagnetic shielding structure configured to shield from electromagnetic interference, wherein the electromagnetic shielding structure is disposed on the flexible substrate.

16. The electronic device as claimed in claim 15, further comprising a second function assembly;
wherein the flexible substrate further comprises at least one third region and at least one second bendable region, wherein the at least one third region is connected to one of the at least one second region through the at least one second bendable region, the at least one second bendable region has a second metal wiring, and the second function assembly is disposed on the at least one third region.

17. The electronic device as claimed in claim 15, wherein the display function layer comprises:

a TFT array layer disposed on the flexible substrate;
a light emitting layer disposed on the TFT array layer;
a thin film packaging layer disposed on the light emitting layer; and
a transparent protective layer disposed on the thin film packaging layer.

18. The electronic device as claimed in claim 17, wherein the display function layer further comprises a polarizer and a touch control layer, and both of the polarizer and the touch control layer are disposed between the thin film packaging layer and the transparent protective layer; and wherein adhesive layers are disposed between the polarizer, the touch control layer, the thin film packaging layer and the transparent protective layer.

* * * * *